United States Patent [19]
Watanabe

[11] Patent Number: 5,898,204
[45] Date of Patent: Apr. 27, 1999

[54] THIN-FILM TRANSISTOR, AND ITS SEMICONDUCTOR DEVICE, ACTIVE MATRIX BOARD, AND LCD DEVICE

[75] Inventor: Takanori Watanabe, Atsugi, Japan

[73] Assignee: Canon Kabushiki Kaisha, Tokyo, Japan

[21] Appl. No.: 08/515,838

[22] Filed: Aug. 16, 1995

[30] Foreign Application Priority Data

Aug. 18, 1994 [JP] Japan .................................. 6-215225

[51] Int. Cl.⁶ .................................................. H01L 27/01
[52] U.S. Cl. ............................... 257/349; 257/59; 257/72; 257/354; 349/43
[58] Field of Search ................................. 257/57, 59, 66, 257/72, 347, 348, 349, 352, 353, 354; 349/43

[56] References Cited

U.S. PATENT DOCUMENTS

| | | | |
|---|---|---|---|
| 4,054,895 | 10/1977 | Ham .......................................... | 357/23 |
| 4,272,880 | 6/1981 | Pashley ...................................... | 29/571 |
| 4,755,481 | 7/1988 | Faraone ...................................... | 437/62 |
| 4,864,380 | 9/1989 | Plus et al. ................................. | 257/354 |
| 4,974,051 | 11/1990 | Matloubian et al. .................... | 257/354 |
| 5,086,009 | 2/1992 | Sangourd ................................. | 437/48 |

*Primary Examiner*—Sara Crane
*Attorney, Agent, or Firm*—Fitzpatrick, Cella, Harper & Scinto

[57] ABSTRACT

A thin-film transistor of a type constructed of the semiconductor region on top of an insulating substrate and the gate electrode on the gate insulating layer on top of the channel of the semiconductor region. The thin-film transistor contains an impurity region of opposite semiconductor type of a source region and a drain region, at least where the side wall of the semiconductor region borders the gate electrode via the insulating layer. The impurity region is doped with a higher impurity concentration than the other semiconductor regions. The above arrangement dramatically lowers current leak in the thin-film transistor, and offers a substantially improved manufacturing yield of thin-film transistor.

15 Claims, 7 Drawing Sheets

THIN-FILM TRANSISTOR, AND ITS SEMICONDUCTOR DEVICE, ACTIVE MATRIX BOARD, AND LCD DEVICE

BACKGROUND OF THE INVENTION

1. Field of the Invention

The present invention relates to a MOS (Metal-Oxide Semiconductor) type, thin-film transistor and a semiconductor device, active matrix board and liquid-crystal display device, into which the thin-film transistor is implemented.

2. Related Background Art

In the manufacturing process of the thin-film transistor (TFT), two types of processes are mainly available for isolating one element from another: mesa and LOCOS (localized oxidation of silicon) processes. In the mesa isolation process, a semiconductor layer is formed entirely on an insulating substrate and unwanted regions of the semiconductor layer are then removed by etching or other techniques. In the LOCOS process, isolation is assured by selectively oxidizing the semiconductor layer. FIGS. 7A and 7B show a prior art thin-film transistor that is manufactured using the mesa isolation process. FIG. 7A is a plan view of the thin-film transistor and FIG. 7B is a cross-sectional view taken along the line 7B—7B in FIG. 7A. Shown in the figures are an insulating substrate 1, a semiconductor region 2, a gate insulating layer 3, a gate electrode 4, a source region 5, and a drain region 6.

The prior art thin-film transistor has the following disadvantage.

In the prior art thin-film transistor, because of the effect of the geometry, a lower threshold value results in regions 76 where the side wall portions (peripheral portions) of the semiconductor region 2 are close to the gate electrode 4 via the gate insulating layer 3, compared to the remaining plane region on which the gate insulating layer 3 and the gate electrode 4 are laminated in plane. The side wall portions of the semiconductor region 2 is subject to the following phenomena: a leak current takes place because of the effect of an interface region that is generated in the isolation process; and the threshold value drops because an impurity concentration is varied due to the effect of segregated areas of impurities and the like. Although FIGS. 7A and 7B show the example of the mesa device, the same problems are encountered in the LOCOS isolation process.

The transistor structure shown in FIGS. 8A and 8B has been proposed to prevent leak currents in the thin-film transistor substrate (U.S. Pat. No. 4,809,056). In FIGS. 8A and 8B, those portions equivalent to those described with reference to FIGS. 7A and 7B are designated with the same reference numerals. In this transistor as shown, the width $W_1$ of the source region 5 and the drain region 6, both being heavily doped n-type regions, is set be narrower than the width $W_2$ of the semiconductor region 2. Designated 81 is a heavily doped p-type region which is provided to keep fixed the potential of the well. The region 81 is more heavily doped than the well and is wired to keep fixed the well potential.

In FIGS. 8A and 8B, although current leakage is less likely to take place by keeping fixed the potential of the well, a leakage path 82 still remains. It is therefore difficult to manufacture at a high yield a semiconductor device which is made up of a large number of transistors. Forming a contact to fix the well potential lowers substantially the level of integration of the semiconductor device.

When the thin-film transistor is applied in the field of the LCD device, as a switching element, current leakage in the thin-film transistor adversely affects the display screen of the LCD device.

FIG. 5 is a schematic diagram showing the circuit of a typical active matrix LCD device. The LCD device is driven by a horizontal shift register 51 and a vertical shift register 52. Fed to the horizontal shift register 51 are a clock pulse 53, a start pulse 54, and a video signal 55. For color display, color video signals may be separately supplied.

The horizontal shift register 51 operates to write a signal on a signal line 56 on the display to drive pixels. A clock pulse 57 and a start pulse 58 are supplied to the vertical shift register 52, which in turn feeds a voltage to gate lines 59 to sequentially turn on the transistors. The signal written on the signal lines is fed to the liquid crystal 61 of each pixel via each pixel transistor 60.

Storage capacitors, though not shown in FIG. 5, may be formed in parallel with the liquid crystals 61 to prevent voltage variations in the pixels arising from current leaks in the pixel transistors and liquid crystals and voltage fluctuations. An attempt to resolve the degradation of image quality arising from the leaks in the transistors by increasing storage capacitance, however, decreases the aperture ratio of the device, and prolongs writing time thereby making it difficult to drive fast the device. This problem is expected to be even more serious in the design of a large-scale or high-resolution display screen panel. In view of the above, it is important to control current leaks in the pixel transistors even with the storage capacitors incorporated.

It is also important to control current leaks in the transistors that constitute the horizontal and vertical shift registers, as the driving circuits. The shift register transfers its input signal to a succeeding stage, one stage by one stage, in synchronism with the clock pulse. The input signal must be held at each stage until a next clock comes in. If current leaks take place in the reset switch that resets the voltage at each stage, the voltage varies to its reset value with time. This leads to the circuit failure in which the function of shift register stops, with the input signal unable to transfer from one stage to the next. Current leaks in the transistors in the peripheral circuits thus should be controlled.

SUMMARY OF THE INVENTION

It is an object of the present invention to provide a thin-film transistor free of current leak and having a high level of integration, more specifically to provide the thin-film transistor in which current leak is prevented without any large scale design change incorporated and without the use of any structure that lowers the level of integration.

According to an aspect of the present invention, there is provided a thin-film transistor comprising a semiconductor region on top of an insulating substrate and a gate electrode on top of a channel of the semiconductor region where a gate insulating layer is put between the gate electrode and the semiconductor region, comprising an impurity region, which thin-film transistor has a semiconductor type opposite to that of source and drain regions in the semiconductor region and is more heavily doped than another semiconductor region, in at least a region where a side wall portion of the semiconductor region borders the gate electrode and the gate insulating layer is put between the side wall portion and the gate electrode. The heavily doped impurity region may surround entirely the side wall portion of the semiconductor region. The heavily doped impurity region also may remain electrically floating.

The present invention comprises the semiconductor device, the active matrix board and liquid-crystal display device, all of which are constructed of the above thin-film transistor.

The semiconductor device according to the present invention is constructed of a plurality of the above thin-film transistors.

Therefore, according to another aspect of the present invention, there is provided a semiconductor device comprising a construction obtained by integrating a plurality of the above thin-film transistors.

The active matrix board according to the present invention employs the above thin-film transistor as a switching element connected to each pixel electrode.

Therefore, according to still another aspect of the present invention, there is provided an active matrix board which comprises a plurality of pixel electrodes and a plurality of switching elements connected respectively to the plurality of pixel elecrodes, wherein the above thin-film transistor is employed as the switching element.

The liquid-crystal display device according to the present invention comprises liquid crystals sandwiched between the active matrix board and a board facing the active matrix board.

Therefore, according to a further aspect of the present invention, there is provided a liquid-crystal display device which comprises an active matrix board comprising a plurality of pixel electrodes and a plurality of switching elements connected respectively to the plurality of pixel electrodes, and an opposing board opposing to the active matrix board, wherein a liquid-crystal material is sandwiched between the active matrix board and the opposing board, and a thin-film transistor is employed as the switching element.

The thin-film transistor of the present invention solves the above-mentioned problem and thus achieves the above object. The thin-film transistor of the present invention prevents the leak current without any scaling up in size.

Fully exploiting the advantage of the thin-film transistor according to the present invention, the liquid-crystal display device of the present invention stably displays an image of excellent quality in high-brightness and multiple gradations.

DETAILED DESCRIPTION OF THE PREFERRED EMBODIMENTS

Figure 1A:
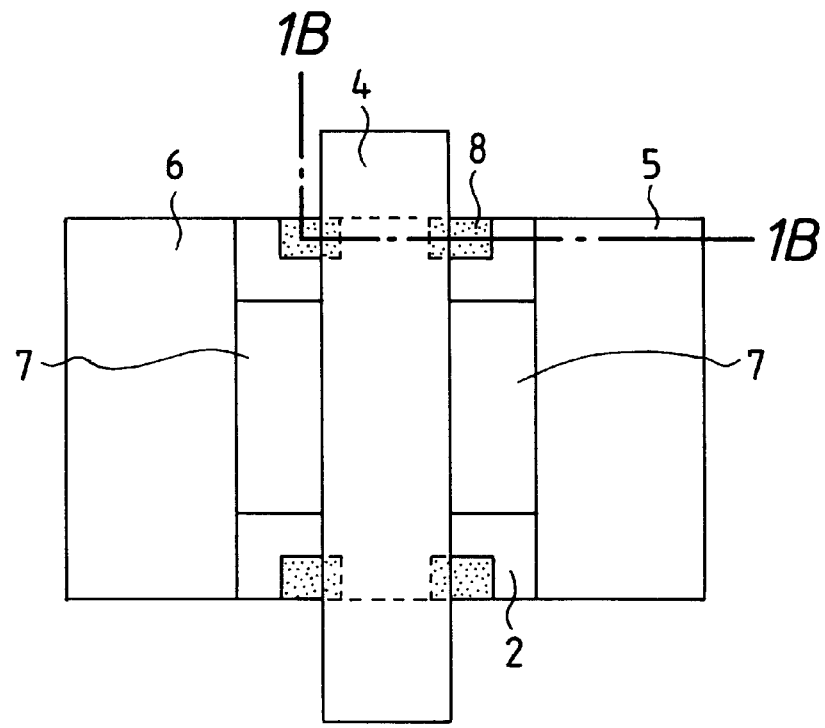
FIGS. 1A and 1B are diagrammatic views showing an example of the thin-film transistor according to the present invention.

Referring now to the drawings, the embodiments of the present invention are discussed.

[Embodiment 1]

Figure 1B:
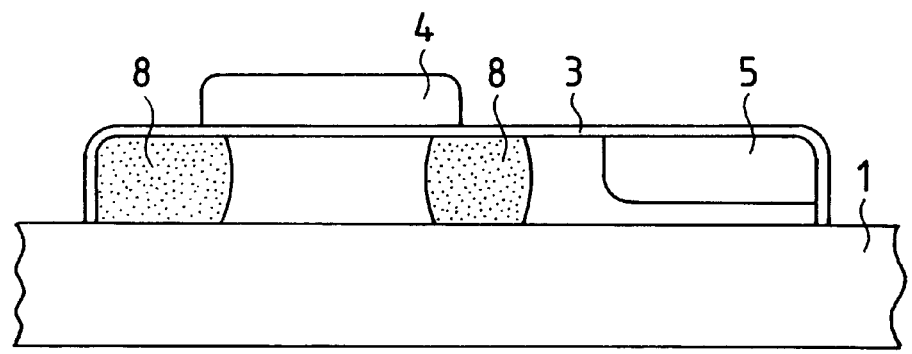

FIGS. 1A and 1B show an example of the thin-film transistor of the present invention. FIG. 1A is a plan view of the thin-film transistor, and FIG. 1B is a cross-sectional view taken along the line 1B—1B in FIG. 1A. The thin-film transistor in this embodiment is a p-type TFT. Shown in the figures are an insulating substrate 1, a semiconductor region 2, a gate insulating layer 3, and a gate electrode 4.

In this embodiment, the semiconductor region 2 may be formed of single crystal Si using a SIMOX (Separation by Implanted Oxygen) substrate or a laminated SOI (Silicon On Insulator) substrate. Alternatively, the semiconductor region 2 may be formed by growing a polycrystal Si onto a quartz substrate by CVD technique. Furthermore, the semiconductor region 2 may be formed by allowing a semiconductor substrate of Si or the like to be heat oxidized to grow a new insulating layer, and then forming a polycrystal Si layer on the insulating layer. The gate insulating layer 3 may be formed by oxidizing the surface of the semiconductor region 2.

The semiconductor region 2 contains a heavily p-type doped region 5 as the source region, a heavily p-type doped region 6 as the drain region, a lightly p-type doped region 7 which raises withstand voltage by lessening electric field strength, and a heavily n-type doped region 8 for controlling the current leak. The p-type doped region 7 may be formed in an ion implantation process in gate self-alignment after the formation of the gate electrode 4. The n-type region 8 may be formed by introducing an impurity in an ion implantation process after the formation of the gate electrode 4. Then, the impurity is allowed to diffuse through the region where the gate electrode 4 and the side wall of the semiconductor region 3 close when heat is applied for activation. The n-type region 8 is spaced apart from the p-type regions 5 through 7, to prevent concentration of electric field from lowering drain withstand voltage.

In FIGS. 1A and 1B, the contacts and wiring for the source, drain and gate electrodes are intentionally omitted.

In this embodiment, the use of n-type region 8 blocks the leak path improving cutoff characteristics.

In this embodiment, the p-type MOS thin-film transistor has been explained. The same advantage will result in the n-type MOS thin-film transistor if reversely doped impurity regions are provided.

[Embodiment 2]

Before the formation of the gate electrode 4, the ion implantation may be performed to form a heavily doped n-type region 8 in the region where the side wall of the semiconductor portion 2 borders the gate electrode 4.

Figure 2A:
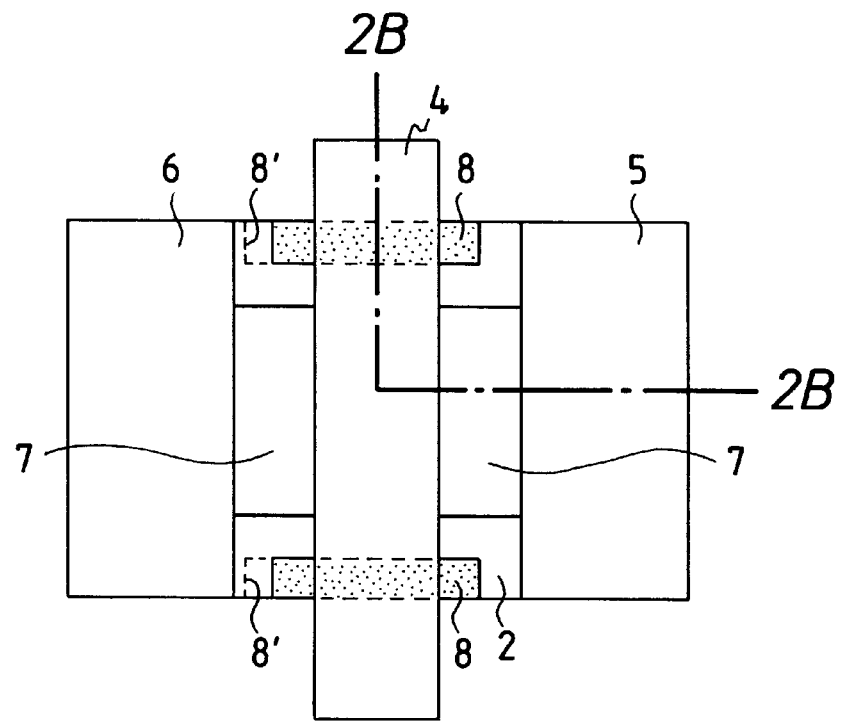
FIGS. 2A and 2B are diagrammatic views showing an example of the thin-film transistor according to the present invention.
Figure 2B:
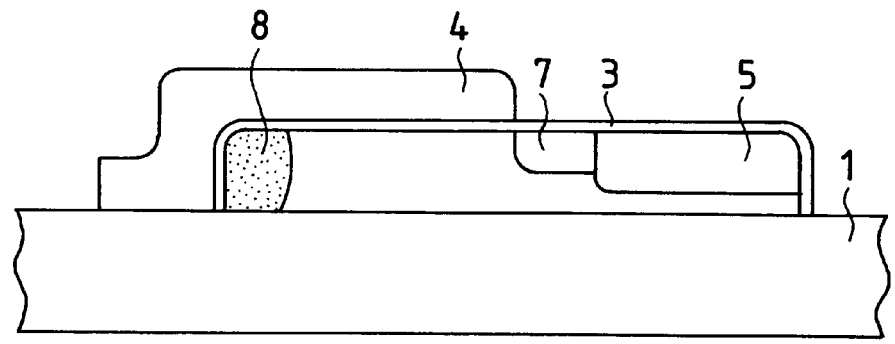

FIGS. 2A and 2B show a TFT. FIG. 2A is a plan view of the TFT, and FIG. 2B is a cross-sectional view taken along the line 2B—2B in FIG. 2A. Since this embodiment has a wide heavily doped n-type region, compared to embodiment 1, the effect of the current leak prevention is enhanced. As for the margin in mask alignment, embodiment 2 allows the n-type doped region 8 to be formed beneath the gate electrode 4 as shown in FIGS. 2A and 2B even if a mask misalignment takes place shifting the n-type doped region 8 from the gate electrode 4. The size of the TFT can thus be reduced.

[Embodiment 3]

Figure 3A:
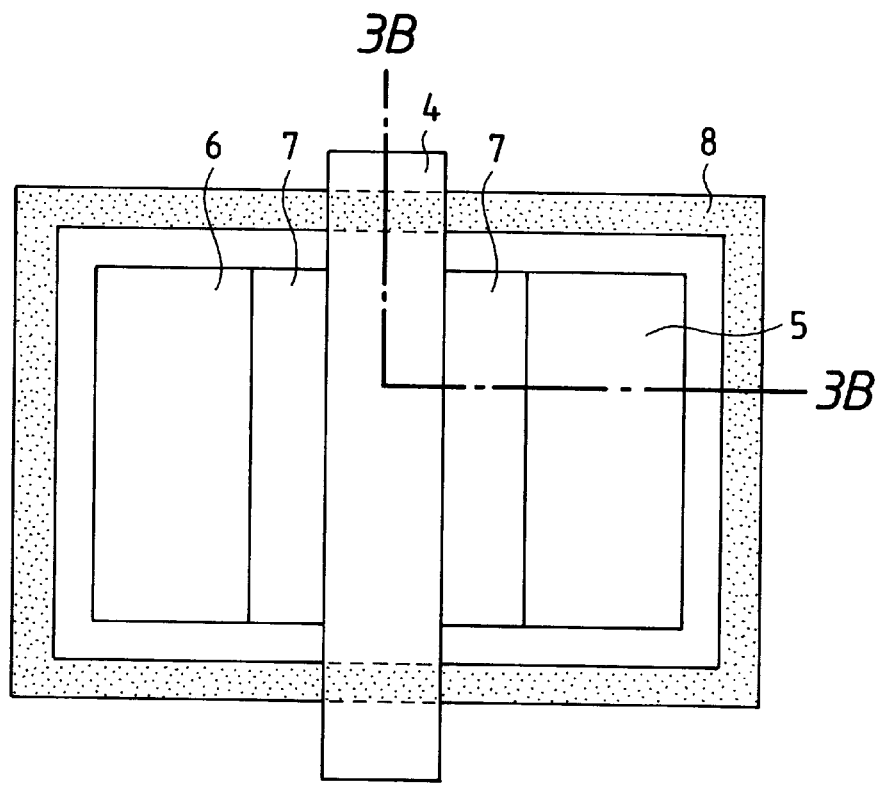
FIGS. 3A and 3B are diagrammatic views showing an example of the thin-film transistor according to the present invention.
Figure 3B:
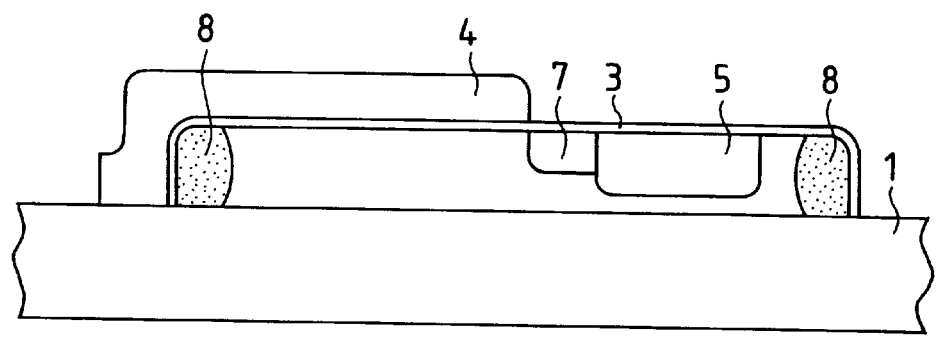

FIGS. 3A and 3B show the TFT of embodiment 3. This TFT is also the p-type one. FIG. 3A is a plan view of the TFT, and FIG. 3B is a cross-sectional view taken along the line 3B—3B in FIG. 3A.

In this embodiment, a heavily n-type doped region 8 is formed entirely along the side wall of the conductor region 2. In this arrangement, the depletion region formed by the pn junction around the drain region 6 is kept out of contact with the side wall of the semiconductor region 2. In addition to the advantages of embodiments 1 and 2, embodiment 3 controls current leak due to interfacial energy level at the side wall of the semiconductor region 2.

Suppose now that the pn junction between the drain region 6 and the low concentration area of the semiconductor region 2 is negatively biased at 10 volts in actual TFT operational conditions. Assuming that the drain region 6 has an impurity concentration of $1 \times 10^{20}$ and the semiconductor region 2 has a well concentration of $1 \times 10^{16}$, the width of the depletion region generated is approximately 1.2 $\mu$m. To keep the depletion region out of contact with the side wall of the semiconductor region 2, the drain region 6 must be spaced apart from the side wall of the semiconductor region 2 by 1.5 to 2 $\mu$m with a margin incorporated. In this embodiment, the presence of the heavily n-type doped 8 around the side wall of the semiconductor region 2 restricts the extension of the depletion region. For example, when, to increase withstand voltage, the drain region 6 is spaced apart from the heavily n-type doped region by 0.5 $\mu$m, and the n-type region is set to be 0.5 $\mu$m wide, the separation between the drain region 6 and the side wall of the semiconductor region 2 is 1 $\mu$m. Compared to the case where no heavily n-type doped region is incorporated, a size reduction of approximately 1 $\mu$m is achieved.

In the above arrangement, the thin-film transistor in this embodiment blocks current leak without degrading the level integration and results in improved cutoff characteristics.

[Embodiment 4]

Figure 4:
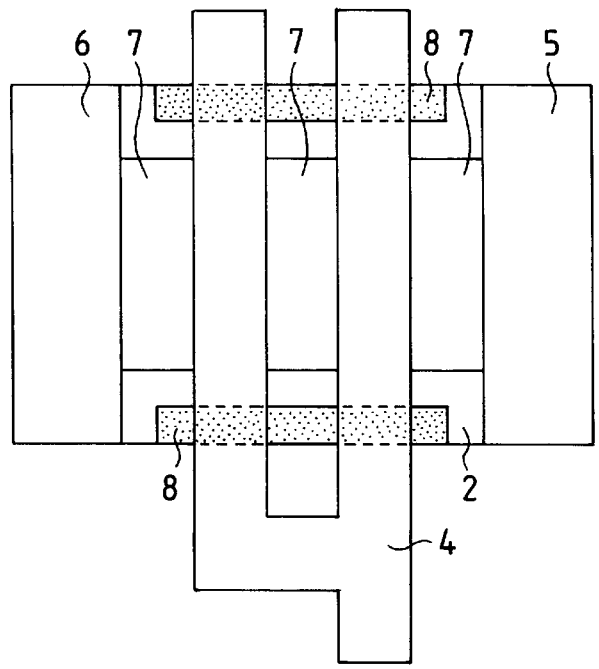
FIG. 4 is a diagrammatic view showing an example of the thin-film transistor according to the present invention.
Figure 5:
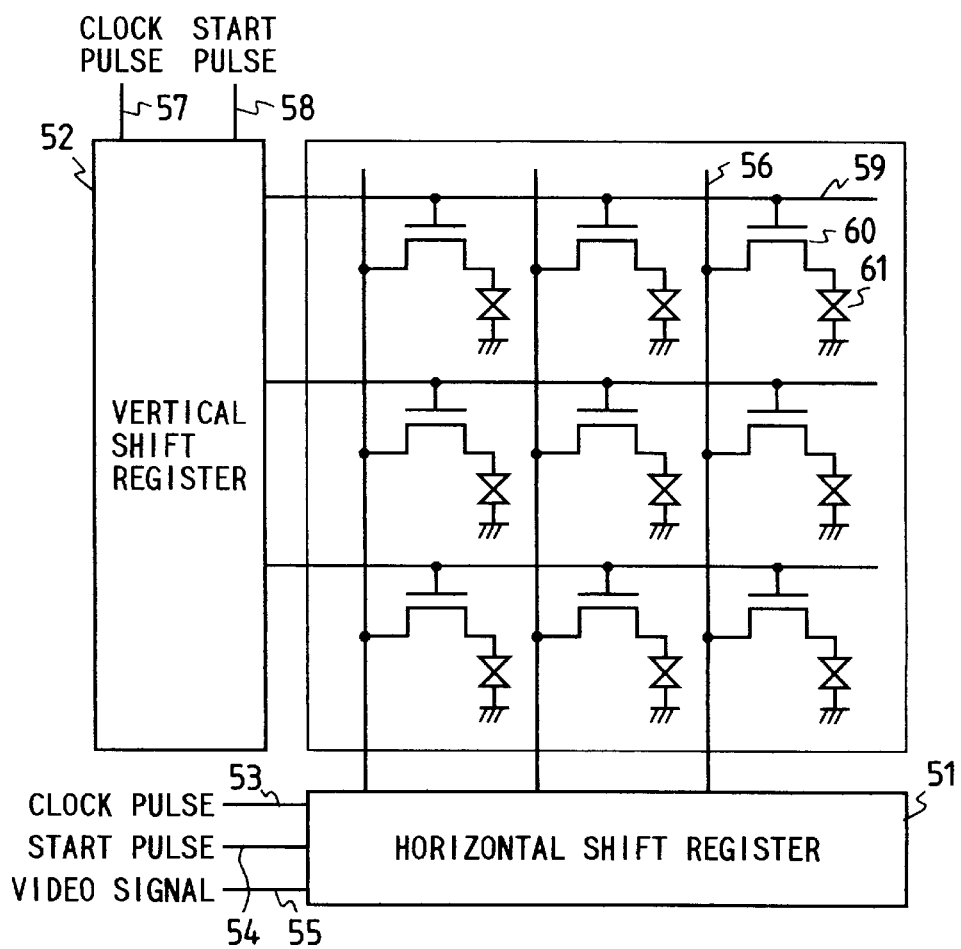
FIG. 5 is a schematic diagram showing an example of the active matrix type, liquid-crystal display device.

The TFT structure in FIG. 4 is contemplated to decrease leakage current further and to achieve an improved manufacturing yield. The thin-film transistor in this embodiment has the gate electrode 4 branched off and a structure of two transistors connected in series. Lightly p-type doped regions 7 are formed by ion implantation in gate self-align mode. In the layout shown, heavily n-type doped regions 8 are shared by the two transistors connected in series. Also shared by the two transistors are the source region 5 and the drain region 6. Thus, this dual-transistor structure results in no substantial increase in size. Such a structure dramatically decreases the frequency of occurrence of current leak.

A circuit constructed of the TFTs of embodiments 1 through 4 not only achieves a high manufacturing yield but also results in improved basic performance. For example, if the present invention is applied to selecting transistors of a DRAM memory chip, the magnitude of current leak is lowered, and charge storage capacitance of each cell may be reduced accordingly. With its size remaining unchanged, the DRAM memory chip may accommodate a larger memory capacity.

The thin-film transistor according to the present invention needs no contact for fixing the voltage of the wells, the size of each TFT itself may be reduced. The prior art thin-film transistor needs three contacts, one for each of the source, drain and well contacts. The thin-film transistor according to the present invention needs only two contacts. Assuming that the area of the channel is approximately equal to the area of the contacts and their immediate areas, the thin-film transistor according to the present invention is two-thirds the prior art thin-film transistor. Furthermore, the wiring for powering the well voltage is dispensed with, and the level of integration will be enhanced even more.

[Embodiment 5]

Figure 6:
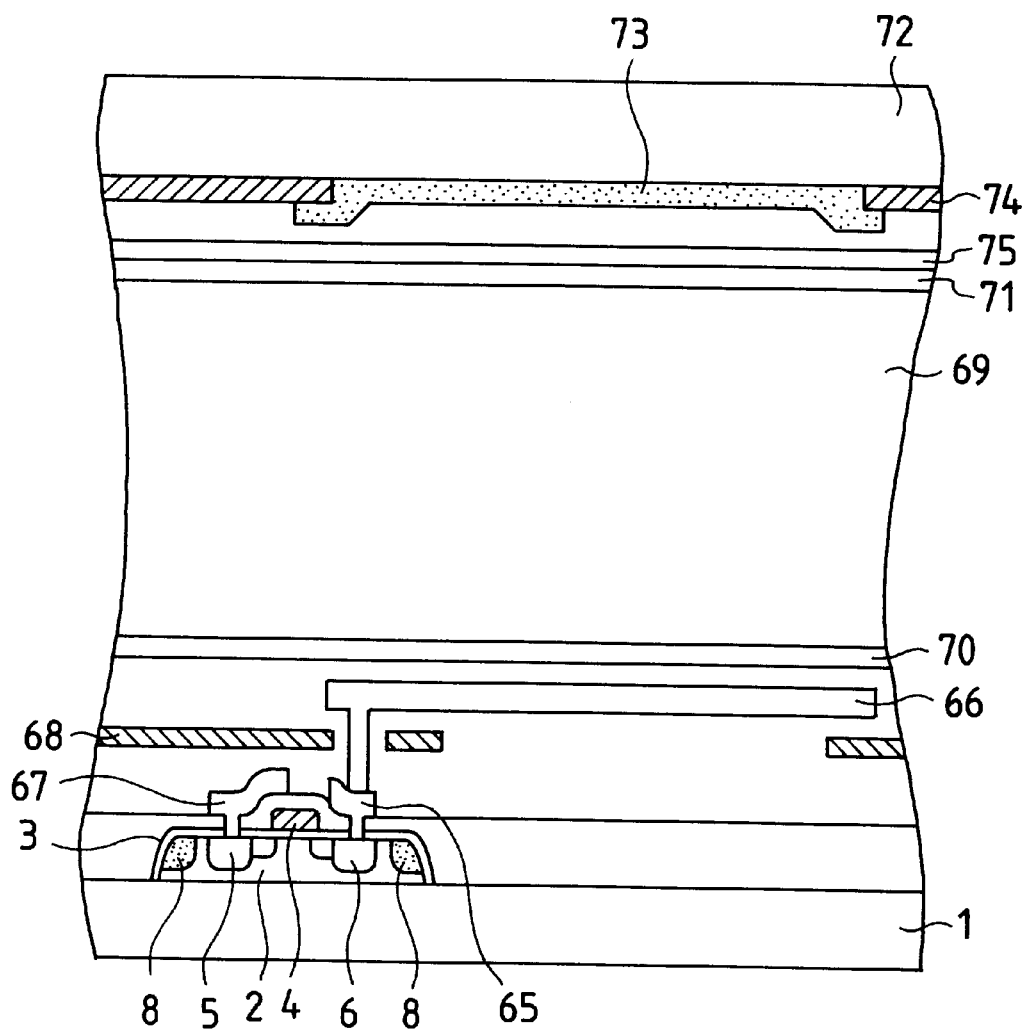
FIG. 6 is a cross-sectional view showing an example of the liquid-crystal display device according to the present invention.
Figure 7A:
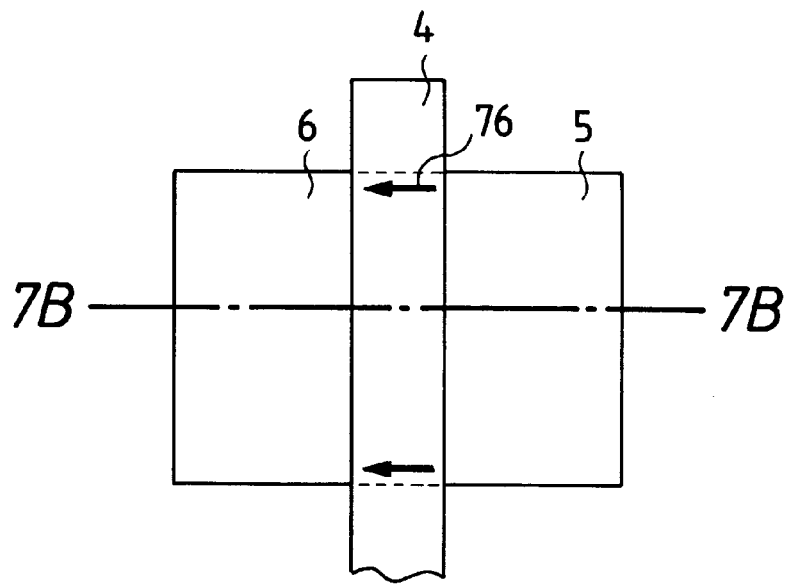
FIGS. 7A and 7B are diagrammatic views showing an example of the prior art thin-film transistor.
Figure 7B:
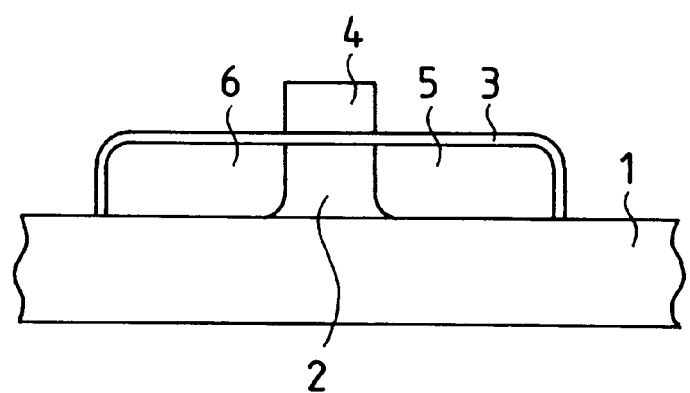
Figure 8A:
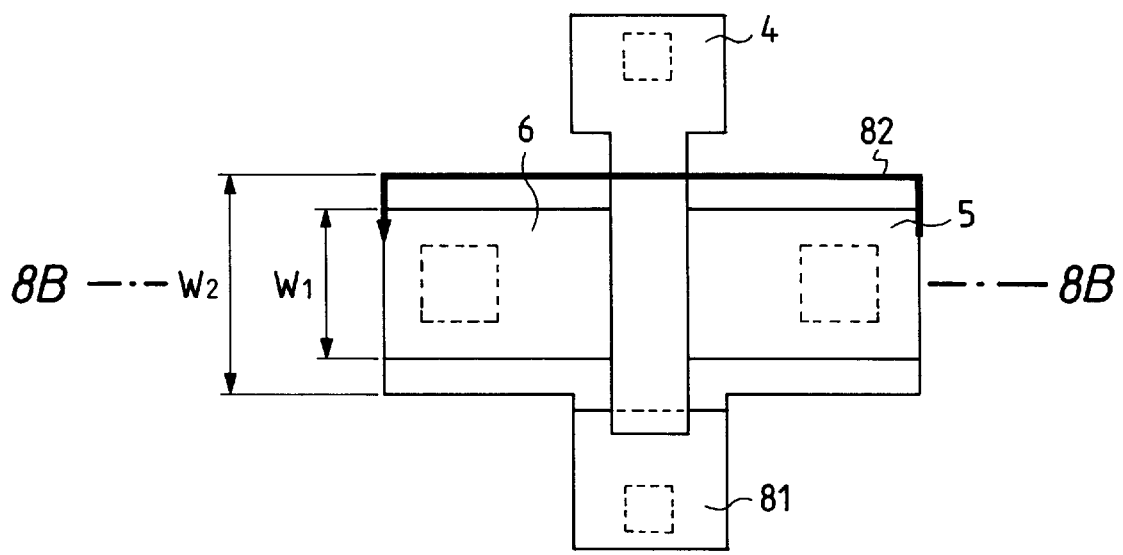
FIGS. 8A and 8B are diagrammatic views showing an example of the prior art thin-film transistor.
Figure 8B:
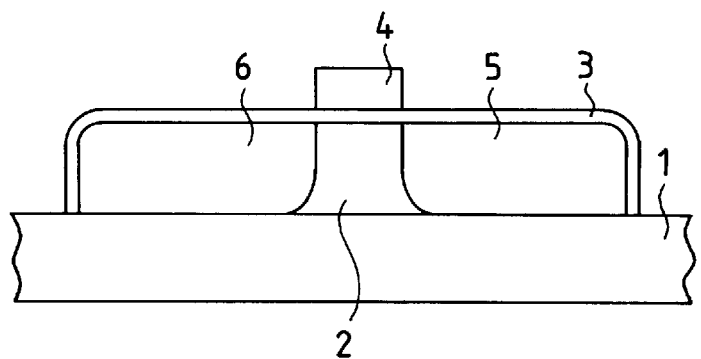

This embodiment is the liquid crystal display device. FIG. 6 is the cross-sectional view showing the liquid crystal display, or transmissive color display device according to the present invention. FIG. 6 shows a transparent insulating substrate 1, an isolated semiconductor device 2 constituting a transistor connected to an electrode 66, and heavily p-type doped source region 5 and drain region 6. The drain region 6 is connected to the transparent pixel electrode 66 via its contact and metal wiring. The source region 5 is connected to a signal wiring 67. Designated 8 is an n$^+$region. Arranged on the transparent insulating substrate 1 are transistors, pixel electrodes, and alignment layers to make up a so-called active matrix board.

The on/off operation of the transistor is controlled by the gate electrode 4 formed on the gate insulating layer 3. Designated 68 is a light-cutting layer which cuts off light to the transistors and cuts off light in the region where the pixel electrodes 66 cannot control alignment of liquid crystals.

A liquid crystal layer 69 is sandwiched between the alignment layers 70, 71. The alignment layers 70, 71 are produced by subjecting polyimide to rubbing. Shown also in FIG. 6 are a covering plate 72, a color filter 73, a black stripe 74 for preventing color mixing, and a transparent common electrode 75.

The liquid crystal corresponding to each pixel is controlled by the voltage applied between the common electrode 75 and the pixel electrode 66. In FIG. 6, a capacitance for keeping the voltage of the pixel electrode 66 is intentionally omitted. The thin-film transistor of the present invention is used as the pixel transistor. In FIG. 6, the thin-film transistor of embodiment 3 is used. Designated 8 is the heavily n-type doped region.

According to embodiment 5 of the present invention, TFT current leak is controlled; thus, voltage variations at the pixel electrode in storage time is small and a display device of multiple gradations thus results.

Since in the liquid-crystal display device according to the present invention, the manufacturing yield of thin-film transistors is dramatically improved, the frequency of occurrence of dot defects due to current leaks in the pixel transistors is substantially lowered and thereby a display screen panel of a large number of pixels results.

In the liquid-crystal display device according to the present invention, the thin-film transistor is designed without any substantial scaling up in size from the prior art thin-film transistor. Thus, the aperture ratio of the device remains the same as the prior art.

The liquid-crystal display device of the present invention thus offers a high-brightness, multiple-gradation, and high-resolution image.

What is claimed is:

1. A field effect transistor comprising:

an insulating substrate;

a semiconductor layer formed on said insulating substrate;

a source region and a drain region having a first conduction type formed in said semiconductor layer, said source region and drain region having thicknesses which do not reach said insulating substrate;

a first semiconductor region located between said source region and said drain region;

a second semiconductor region having a second conduction type opposite to the first conduction type formed in said semiconductor layer, which second semiconductor region surrounds an entire outer circumference of a set of said source, drain and first semiconductor regions;

a third semiconductor region having the second conduction type and an impurity concentration larger than that in the second semiconductor region formed in said semiconductor layer, which third semiconductor region surrounds an entire outer circumference of said second semiconductor region; and a gate electrode located on said first semiconductor region via an insulating layer.

2. A field effect transistor according to claim 1, wherein said first semiconductor region is comprised of a semiconductor having the first conduction type and an impurity concentration lower than those in said source and drain regions.

3. A field effect transistor according to claim 1, wherein said source region and said drain region are comprised of a p-type semiconductor respectively, and said second and third semiconductor regions are comprised of a n-type semiconductor respectively.

4. A field effect transistor according to claim 3, wherein said third semiconductor region remains electrically floating.

5. A field effect transistor according to claim 4, wherein said source region, said drain region, said first semiconductor region, said second semiconductor region, and said third semiconductor region are located on an insulating substrate.

6. A semiconductor device which is fabricated by integrating a plurality of said field effect transistors according to any of claims 1 through 5.

7. An active matrix board comprising:

a substrate;

a plurality of pixel electrodes formed on said substrate; and a plurality of switching elements connected to said pixel electrodes;

wherein each said switching element is comprised of a field effect transistor comprising:
an insulating substrate;
a semiconductor layer formed on said insulating substrate;
a source region and a drain region, having a first conduction type formed in said semiconductor layer, said source region and drain region having thicknesses which do not reach said insulating substrate;
a first semiconductor region located between said source region and said drain region;
a second semiconductor region having a second conduction type opposite to the first conduction type formed in said semiconductor layer, which second semiconductor region surrounds an entire outer circumference of a set of said source, drain and first semiconductor regions;
a third semiconductor region having the second conduction type and an impurity concentration larger than that in the second semiconductor region formed in said semiconductor layer, which third semiconductor region surrounds an entire outer circumference of said second semiconductor region; and
a gate electrode located on said first semiconductor region via an insulating layer.

8. An active matrix board according to claim 7, wherein said first semiconductor region of said field effect transistor is comprised of a semiconductor having the first conduction type and an impurity concentration lower than those in said source and drain regions.

9. An active matrix board according to claim 7, wherein said source region and said drain region of said field effect transistor are comprised of a p-type semiconductor respectively, and said second and third semiconductor regions are comprised of an n-type semiconductor respectively.

10. An active matrix board according to claim 7, wherein said third semiconductor region of said field effect transistor remains electrically floating.

11. An active matrix board according to claim 7, wherein said substrate is comprised of an insulating substrate.

12. A liquid crystal display device comprising:

an active matrix board having a plurality of pixel electrodes and a plurality of switching elements connected to said pixel electrodes;

an opposing board; and a liquid crystal material sandwiched between said active matrix board and said opposing board;

wherein each said switching element is comprised of a field effect transistor comprising:
an insulating substrate;
a semiconductor layer formed on said insulating substrate;
a source region and a drain region, having a first conduction type formed in said semiconductor layer, said source region and drain region having thicknesses which do not reach said insulating substrate;
a first semiconductor region located between said source region and said drain region;
a second semiconductor region having a second conduction type opposite to the first conduction type formed in said semiconductor layer, which second semiconductor region surrounds an entire outer circumference of a set of said source, drain and first semiconductor regions;
a third semiconductor region having the second conduction type and an impurity concentration larger than that in the second semiconductor region formed in said semiconductor layer, which third semiconductor region surrounds an entire outer circumference of said second semiconductor region; and
a gate electrode located on said first semiconductor region via an insulating layer.

13. A liquid crystal display device according to claim 12, wherein said first semiconductor region of said field effect transistor is comprised of a semiconductor having the first conduction type and an impurity concentration lower than those in said source and drain regions.

14. A liquid crystal display device according to claim 12, wherein said source region and said drain region of said field effect transistor are comprised of a p-type semiconductor respectively, and said second and third semiconductor regions are comprised of an n-type semiconductor respectively.

15. A liquid crystal display device according to claim 12, wherein said third semiconductor region of said field effect transistor remains electrically floating.

* * * * *

UNITED STATES PATENT AND TRADEMARK OFFICE
CERTIFICATE OF CORRECTION

PATENT NO. : 5,898,204
DATED : April 27, 1999
INVENTOR(S) : TAKANORI WATANABE

It is certified that error appears in the above-indentified patent and that said Letters Patent is hereby corrected as shown below:

COLUMN 1

Line 50, "be" should read --to be--.

COLUMN 2

Line 45, "large scale" should read --large-scale--.

COLUMN 5

Line 18, "doped 8" should read --doped region 8--.

COLUMN 7

Line 14, "a" should read --an--.

Signed and Sealed this

Twenty-third Day of November, 1999

Attest:

Q. TODD DICKINSON

*Attesting Officer*　　　*Acting Commissioner of Patents and Trademarks*